(12) United States Patent
Raaijmakers

(10) Patent No.: US 7,431,767 B2
(45) Date of Patent: *Oct. 7, 2008

(54) APPARATUS AND METHOD FOR GROWTH OF A THIN FILM

(75) Inventor: Ivo Raaijmakers, Bilthoven (NL)

(73) Assignee: ASM America, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/605,615

(22) Filed: Nov. 27, 2006

(65) Prior Publication Data

US 2007/0089669 A1 Apr. 26, 2007

Related U.S. Application Data

(60) Continuation of application No. 10/317,266, filed on Dec. 10, 2002, now Pat. No. 7,141,499, which is a division of application No. 09/392,371, filed on Sep. 8, 1999, now Pat. No. 6,511,539.

(51) Int. Cl.
C30B 25/12 (2006.01)

(52) U.S. Cl. ............... 117/95; 427/251; 118/723 ER; 118/723 R; 117/89; 117/100

(58) Field of Classification Search ............... 438/685; 427/255; 118/723 ER, 723 R; 117/89, 95, 117/100

See application file for complete search history.

(56) References Cited

U.S. PATENT DOCUMENTS

| | | | |
|---|---|---|---|
| 4,058,430 A | 11/1977 | Suntola et al. | |
| 4,282,267 A | 8/1981 | Küyel | |
| 4,389,973 A | 6/1983 | Suntola et al. | |
| 4,747,367 A | 5/1988 | Posa | |
| 4,761,269 A | 8/1988 | Conger et al. | |
| 4,767,494 A | 8/1988 | Kobayashi et al. | |
| 4,851,095 A | 7/1989 | Scobey et al. | |

(Continued)

FOREIGN PATENT DOCUMENTS

EP 0 442 490 A1 8/1991

(Continued)

OTHER PUBLICATIONS

Molsa et al., "Deposition of Cerium Dioxide Thin Films on Silicon Substrates by Atomic Layer Epitaxy", Materials Research Society, 1994, pp. 341-350, vol. 335.

(Continued)

*Primary Examiner*—Felisa C Hiteshew
(74) *Attorney, Agent, or Firm*—Knobbe Martens Olson & Bear LLP

(57) ABSTRACT

An improved apparatus and method for substrate layer deposition in which substrate layers are grown by carrier gas delivery of sequential pulses of reactants to the substrate surface. At least one of the reactants comprises excited species, e.g., radicals. In a specific embodiment, the apparatus of this invention provides sequential repeated pulses of reactants in a flow of carrier gas for reaction at a substrate surface. The reactant pulses are delivered with sufficient intervening delay times to minimize undesirable reaction between reactants in adjacent pulses in the gas phase or undesired uncontrolled reactions on the substrate surface.

13 Claims, 3 Drawing Sheets

U.S. PATENT DOCUMENTS

| | | | |
|---|---|---|---|
| 4,935,661 A | 6/1990 | Heinecke et al. | |
| 5,071,670 A | 12/1991 | Kelly | |
| 5,166,092 A | 11/1992 | Mochizuki et al. | |
| 5,180,435 A | 1/1993 | Markunas et al. | |
| 5,221,556 A | 6/1993 | Hawkins et al. | |
| 5,270,247 A | 12/1993 | Sakuma et al. | |
| 5,356,673 A | 10/1994 | Schmitt et al. | |
| 5,443,647 A | 8/1995 | Aucoin et al. | |
| 5,522,934 A * | 6/1996 | Suzuki et al. | 118/723 AN |
| 5,618,395 A | 4/1997 | Gartner | |
| 5,620,523 A * | 4/1997 | Maeda et al. | 118/723 IR |
| 5,693,139 A | 12/1997 | Nishizawa et al. | |
| 5,711,811 A | 1/1998 | Suntola et al. | |
| 5,769,950 A | 6/1998 | Takasu et al. | |
| 5,855,680 A | 1/1999 | Soininen et al. | |
| 5,868,849 A * | 2/1999 | Nakao | 118/723 MW |
| 5,916,365 A | 6/1999 | Sherman | |
| 5,993,916 A | 11/1999 | Zhao et al. | |
| 6,015,590 A | 1/2000 | Suntola et al. | |
| 6,104,074 A | 8/2000 | Chen | |
| 6,113,977 A | 9/2000 | Soninen et al. | |
| 6,139,700 A | 10/2000 | Kang et al. | |
| 6,188,134 B1 | 2/2001 | Stumborg et al. | |
| 6,200,389 B1 | 3/2001 | Miller et al. | |
| 6,200,893 B1 | 3/2001 | Sneh | |
| 6,203,613 B1 | 3/2001 | Gates et al. | |
| 6,270,572 B1 | 8/2001 | Kim et al. | |
| 6,342,277 B1 | 1/2002 | Sherman | |

FOREIGN PATENT DOCUMENTS

| | | |
|---|---|---|
| EP | 0 526 779 A1 | 10/1993 |
| WO | WO 96/17107 | 6/1996 |
| WO | WO 00/54320 | 9/2000 |
| WO | WO 00/61833 | 10/2000 |
| WO | WO 00/63957 | 10/2000 |

OTHER PUBLICATIONS

Claim Construction of United States Patents Nos. 6,015,590, 5,916,365 and 5,294,568; filed Aug. 15, 2002.

Opening Claim Construction Brief of the ASM Parties Regarding the 365 Patent, Case No. C 01 2190 EDL, filed May 3, 2002.

Opening Claim Construction Brief of ASM Regarding the 590 Patent, Case No. C 01 2190 EDL, filed May 3, 2002.

Genus' Claim Construction Brief Regarding U.S. Patent No. 6,015,590, Case No. C 01-02190 EDL, filed May 17, 2002.

Genus' Claim Construction Brief Regarding U.S. Patent No. 5,916,365, Case No. C 01-02190 EDL, filed on May 17, 2002.

ASM's Claim Construction Reply Brief Regarding the 365 Patent, Case No. C 01 2190 EDL, filed on May 24, 2002.

Reply Claim Construction Brief of ASM Regarding the 590 Patent, Case No. C 01 2190 EDL, filed May 24, 2002.

Abeles, B. et al., "Amorphous Semiconductor Superlattices," *Physical Review Letters*, vol. 51, No. 21, pp. 2003-2006 (1983).

De Keijser, M. et al., "Atomic layer epitaxy of gallium arsenide with the use of atomic hydrogen," *Appl. Phys. Lett.*, vol. 58, No. 11, pp. 1187-1189 (1991).

Fan, J. F. et al., "Low-Temperature Growth of Thin Films, of $Al_2O_3$ with Trimethylaluminum and Hydrogen Peroxide," *Mat. Res. Soc. Symp. Proc.*, vol. 222, pp. 327-332 (1991).

Hiramatsu, K. et al., "Formation of TiN films with low Cl concentration by pulsed plasma chemical vapor deposition," *J. Vac. Sci. Technol. A*, vol. 14, No. 3, pp. 1037-1040 (1996).

Imai, S. et al., "Atomic layer epitaxy of Si using atomic H," *Thin Solid Films*, vol. 225, pp. 168-172 (1993).

Koleske, D. D. et al., "Atomic layer epitaxy of Si on Ge(100) using $Si_2Cl_6$ and atomic hydrogen," *Appl. Phys. Lett.*, vol. 64, No. 7, pp. 884-886 (1994).

Leskelä, M. et al., "Atomic Layer Epitaxy in Deposition of Various Oxide and Nitride Thin Films," *Journal De Physique IV, Colloque C5, supplément au Journal de Physique II*, vol. 5, pp. C5-937-C5-951 (1995).

Mahajan, A. et al. "Si atomic layer epitaxy based on $Si_2H_6$ and remote He plasma bombardment," *Thin Solid Films*, vol. 225, pp. 177-182 (1993).

Nakano, M. et al., "Digital chemical vapor deposition of $SiO_2$," *Appl. Phys. Lett.*, vol. 57, No. 11, pp. 1096-1098 (1990).

Sakaue, H. et al., "Digital Chemical Vapor Deposition of SiO2 Using a Repetitive Reaction of triethylsilane/Hydrogen and Oxidation," *Japanese Journal of Applied Physics*, vol. 30, No. 1B, pp. L124-L127 (1990).

Sugahara, S. et al., "Atomic layer epitaxy of germanium," *Applied Surface Science*, vols. 82/83, pp. 380-386 (1994).

Sugahara, S. et al., "Modeling of germanium atomic-layer-epitaxy," *Applied Surface Science*, vol. 112, pp. 176-186 (1997).

Sugahara, S. et al., "Atomic hydrogen-assisted ALE of germanium," *Applied Surface Science*, vol. 90, pp. 349-356 (1995).

* cited by examiner

APPARATUS AND METHOD FOR GROWTH OF A THIN FILM

REFERENCE TO RELATED APPLICATIONS

The present application claims priority under 35 U.S.C. § 120 as a continuation of U.S. application Ser. No. 10/317,266, filed Dec. 10, 2002 now U.S. Pat. No. 7,141,499, which is a divisional of U.S. application Ser. No. 09/392,371, filed Sep. 8, 1999 now U.S. Pat. No. 6,511,539.

BACKGROUND OF THE INVENTION

This invention relates generally to improved apparatus and methods for deposition processes in the manufacture of semiconductor materials.

Chemical vapor deposition (CVD) processes have long been used to form thin layers on substrates (and wafers) by sequential layer deposition by thermal reaction or decomposition of gaseous material (reactants) at the substrate surface. In a specific type of deposition process, atomic layer epitaxy (ALE), sequential monolayers are deposited on a substrate surface by alternate exposure to chemical reactants. Repeated exposure cycles of the substrate to reactant gases builds the desired layer structure. ALE techniques are described for example in M. Ritala et al. (1998) J. ElectroChemical Society 145: 2914; H. Shrinriki et al. (1998) J. ElectroChemical Society 145:3247 and J. L. Vossen et al. "Thin Film Deposition Processes II" (Academic Press, CA 1991). The terms ALE and "atomic layer chemical vapor desorption," ALCVD™ are considered equivalent in this disclosure.

A variety of apparatus have been employed for layer deposition processes. A basic system includes a reactant chamber, a substrate holder with a heater, a gas flow system including gas inlets for providing reactants to the substrate surface and an exhaust system for removing used gases.

Deposition apparatus are configured for batch processing of multiple substrates or single-substrate processing. Single-substrate processing is presently more preferred for larger substrates to improve uniformity of deposition. Horizontal gas flow reactors, such as described in Ozias U.S. Pat. Nos. 4,846,102; 5,096,534; and 5,244,694 which concentrate reactant gas flow at the substrate surface and particularly those equipped with gas manifolds that create uniform reactant gas velocity profiles (Hawkins et al. U.S. Pat. No. 5,221,556) provide efficient uniform processing of large single substrates.

ALCVD™ deposition processes, particularly as practiced in horizontal flow reactors for single wafer processing, are performed in a step-wise manner, in which a first reactant is introduced into the reaction chamber through a gas inlet or manifold to form a deposited layer on the substrate. Excess reactant gas is then evacuated from the reaction chamber in a pump-down step (see for example, Sherman, U.S. Pat. No. 5,916,365). Optionally, an inert purge gas is flowed through the gas inlet to remove residual reactant. After the pump down, a second reactant is introduced into the chamber to react with the deposited reactant to form the desired substrate layer. Excess reactant is then removed in another pump-down step. Layers are added to the substrate surface by sequential additions of various reactant gases with intervening chamber pump-down. Step-wise processing with chamber evacuation is employed to separate reactant gases and minimize reaction of these gases in the gas phase or in parts of the reaction chamber other than on the substrate to avoid formation of particles that are detrimental to substrate processing and to avoid depletion of reactants. Intervening chamber evacuation steps represent a significant portion of the time required for processing a substrate, in most cases exceeding 50%. A significant decrease in process time leading to a significant decrease in manufacturing cost could be achieved by eliminating the chamber evacuation steps.

Suntola et al. U.S. Pat. No. 4,389,973 and U.S. Pat. No. 5,711,811 describe apparatus for ALE of a substrate in which sequentially applied reactant gases are separated by inert gas phase diffusion barriers. For example, timed pulses of reactant gases are transported into a reaction chamber to interact with the substrate in a continuous flow of carrier gas passing through the chamber. Reactant gases are thus applied separately to the substrate in a continuous gas flow without need of intervening chamber evacuations. U.S. Pat. Nos. 4,747,367 and 4,761,269 (Crystal Specialties) describe chemical vapor deposition methods in which a constant flow and pressure of gas is maintained on sequentially pulsing of reactant gases into a neutral carrier gas stream. When a reactant gas is switched into or out of the carrier gas flow, the carrier gas flow is decreased or increased, respectively, to maintain constant flow and pressure in the reaction chamber. It is important to note that these techniques work only at sufficiently high pressures (>10 torr), where diffusion in the gas phase is sufficiently low.

It is known in substrate deposition processes to employ excited species, particularly radicals, to react with and/or decompose chemical species at the substrate surface to form the deposited layer. In processes using activated species, the apparatus is provided with a device for excitation. Radicals can, for example, be generated (along with ions) by application of RF or microwave energy to form a plasma. A number of alternative methods for formation of radicals are known in the art, including, for example, thermal decomposition and photolysis.

Reactive species, including radicals, can be generated in situ in the reactant chamber at or near the substrate surface or generated remotely and subsequently carried, e.g., by gas flow, to the reaction chamber. See, U.S. Pat. Nos. 4,664,937, 4,615,905 and 4,517,223 for in situ radical generation and U.S. Pat. No. 5,489,362 for remote radical generation. Remote radical generation allows exclusion of potentially undesirable reactive species (e.g., ions) that may be detrimental to substrate processing. However, remote radical generation techniques should provide sufficient radical densities at the substrate surface, notwithstanding the significant losses that can occur on transport of the radical to the reaction chamber. Radical losses are generally severe at higher pressure (>10 Torr), thus precluding the use of higher pressure to separate the reactants in an ALE process.

SUMMARY OF THE INVENTION

The present invention provides an improved apparatus and method for substrate layer deposition in which substrate layers are grown by carrier gas delivery of sequential pulses of reactants to the substrate surface. At least one of the reactants comprises excited species, e.g., radicals. In a specific embodiment, the apparatus of this invention provides sequential repeated pulses of reactants in a flow of carrier gas for reaction at a substrate surface. The reactant pulses are delivered with sufficient intervening delay times to minimize undesirable reaction between reactants in adjacent pulses in the gas phase or undesired uncontrolled reactions on the substrate surface. We have found that depending on reactor design, there is a pressure range where sufficient excited species, including radicals, survive and where an inert gas phase diffusion barrier can be used.

In a more specific embodiment, the present invention provides an improved apparatus and method for substrate layer deposition that combines a horizontal flow reactor chamber having uniform gas flow parallel to and concentrated at the substrate surface with continuous flow carrier gas delivery of sequential concentration pulses of reactants to the substrate surface.

The use of reactant pulses separated in time and space in a carrier gas flow significantly increases the speed of processing because intervening chamber pump down steps are not required. Use of the methods and apparatus of this invention results in high layer growth rates typically greater than about 1-10 nm/min.

In general the method of this invention can be employed in any reaction chamber designed for thin film growth, including among others horizontal flow reactors, vertical furnaces, and stagnant flow reactors, as long as recirculation of reactant gases is minimized.

BRIEF DESCRIPTION OF THE DRAWINGS

FIG. 2A is a reaction chamber with an R excited species generator in the reaction chamber.

FIG. 3A illustrates the reactant pulses at time $t_0$ just as a peak of B* enters the reaction chamber at x=0, where x is the distance along the reaction chamber. The graph illustrates that the concentration pulse travels in the positive x direction due to convection, and broadens with time and distance due to diffusion. FIG. 3B illustrates the A and B* reactant concentration pulses of FIG. 3A at a time $t=t_0+\frac{1}{2}(L_R/v)$ where $L_R$ is the length of the reaction chamber and v is the gas velocity. FIG. 3B illustrates a more preferred embodiment of this invention wherein the pulses of reactants A and B* are sufficiently separated in time and space that there is no overlap of the reactant pulses in the carrier gas flow. No gas phase or uncontrolled reaction should occur in this case. FIG. 3C illustrates a different timing sequence of reactant pulses for the method of this invention indicating a maximum reactant pulse overlap that is typically sufficiently low to avoid undesired reactions.

DETAILED DESCRIPTION OF THE SPECIFIC EMBODIMENTS

The invention is further described by reference to the figures in which the same numbers indicate like features.

Figure 1:
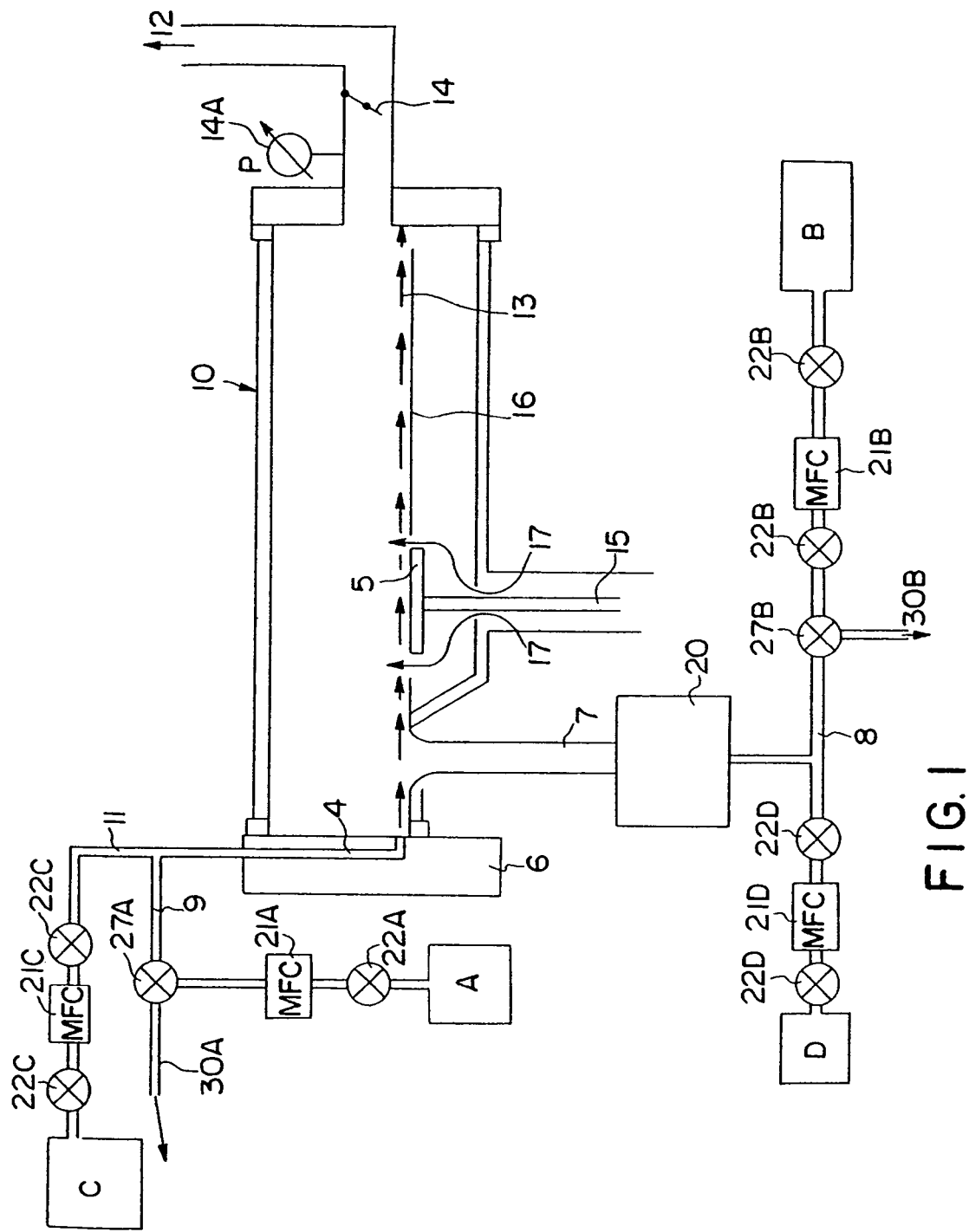
FIG. 1 is a schematic illustration of a reaction chamber of this invention provided with a microwave plasma generator remote from the chamber.

FIG. 1 illustrates a deposition apparatus of this invention adapted for delivery of sequential pulses of two different reactants A and B*, one of which B* contains excited species, to a substrate. The apparatus has a reaction chamber 10 with substrate 5 positioned on holder 15 which is optionally heated. The substrate holder can be heated resistively, inductively or by use of infrared lamps, as is known in the art. Gases flow into the reactor through one or more gas inlets 4 at the injector flange 6. Residual gases, after passage over the substrate are removed through an exhaust conduit 12 provided with a throttle valve 14 and a pressure measurement and control 14A. The reactor chamber illustrated is a radiantly heated, horizontal flow cold wall reactor, typically made of quartz, and having a divider plate 16 substantially aligned with the top surface of the substrate holder and separating the reaction chamber into upper and lower portions. The divider plate provides a substantially constant cross-section in the reaction area, thus, preventing recirculation cells. In order to prevent reactants from reaching the bottom of the reaction chamber, a bottom purge 17 is provided.

A generator of excited species 20 is provided remotely and upstream from the reaction area, and preferably upstream from the chamber 10. Most generally this generator couples an energy source into a flow of a precursor molecule (or mixture to molecules) to generate excited species. In the illustrated embodiment, the generator 20 couples microwave energy from a magnetion to a gas line 8, so that the gas in inlet 7 contains excited species. Alternative generators suitable for use in this apparatus couple thermal energy or visible UV or IR radiation into a precursor. An exemplary microwave radical generator suitable for use in this invention is Rapid Reactive Radicals Technology, $R^3T$, Munich, Germany, model number TWR850. Precursors B are introduced into the excited species generator, illustrated as a microwave plasma generator, through gas line 8. A source of second reactant (A) is provided in gas line 9. A source of carrier gas (C), a gas inert to the reactants and inert to the substrate, is provided in gas line 11. Each gas line is provided with separate mass flow controls (MFC) (21a, b and c) to allow selection of relative amounts of carrier, reactant and excited species B* introduced into the reaction chamber. Shut off valves (22a, b, c) to completely stop the flow of gas are provided in lines 11, 9 and 8. In FIG. 1, C is a carrier gas (e.g., typically $N_2$ or Ar), B is the precursor to the excited species (e.g., $N_2$, $H_2$, $NH_3$, $O_2$) and A is a second reactant gas. Reactant A line 9 is provided with a dump circuit 30a which is in selective communication with line 9 via two-way valve 27a. Precursor B line 8 is optionally provided with a similar dump circuit 30b, two-way valve 27b and inert carrier gas circuit D (22d, 21d), analogous to the circuit for C. In a preferred embodiment, no valves are provided in conduit 7 extending from the generator of excited species to the reaction chamber to minimize decay of excited species during transport to the reaction area. Moreover, in a preferred embodiment, the tube 7 is wide and short (approximately 2 cm in diameter×15 cm long) to minimize wall losses of radicals. In another embodiment, excited species can be introduced in the main carrier gas stream 4, just before it enters in the reactor.

In operation to deposit sequential atomic layers formed by deposition of A followed by reaction of deposited A with excited species derived from B the following preferred procedure is used.

An unprocessed wafer is positioned on the holder in the reaction chamber, as is well known in the art. A main carrier gas C flow (13) is established into the reaction chamber (10) through MFC 21c, valve 22c and the injector flange (6) on the inlet side of the reaction chamber. Typically, in a 200-mm reactor with a cross-section of 50 $cm^2$, a flow of about 50 slm is used. The preferred gas flow is dependent on the design of the chamber and can be optimized without due experimentation. The pressure in the reaction chamber is preferably set at 0.5 to 100 Torr, and preferably 1-20 Torr, and more preferably 2-10 Torr, with conventional techniques using, for example, throttle valves (e.g., 14) and dry pumps (as known in the art, but not shown in FIG. 1). The temperature of the holder (susceptor) and substrate is controlled at a desired value by heating and thermocouple control, as is well known in the art. The optimum temperature is highly dependent on the reactants used. For the exemplary reactions discussed below, the temperature is typically in the range of about 200° C.-500° C.

A flow of reactant A is established at a desired flow rate (typically, <1 slm, dependent upon the exact process chemistry) set by MFC 21a through valve 27a which is initially set to flow into dump circuit 30a. A flow of precursor gas B is established at a desired flow rate (typically a few slm, also dependent upon the exact process chemistry) set by MFC 21b through radical generator 20 via valve 22b. Flow through the generator of excited species may be a mixture of a precursor B in a carrier gas established by components D, 27d, 21d. Alternatively, precursor gas B can be a mixture of a carrier gas and a precursor gas. Initially the radical generator is not switched on, so only non-excited precursor gas is flowing through conduit 7 into the reaction chamber into the flow of carrier gas C. In one embodiment, where excited nitrogen species are employed, both carrier gas C and precursor gas B are nitrogen. In that case, the dump circuit 30b, and carrier gas supply D are not needed.

To begin a cycle of layer deposition, valve 27a is switched from the dump circuit to the reactor inlet for a predetermined time ($t_A$, typically ranging from a fraction of a second to several seconds) and then switched back to the dump circuit providing a concentration pulse of reactant A into the flow of carrier gas C. After a predetermined delay time ($t_S^1$), the radical generator is turned on to provide excited species B*, e.g. radicals, into the reaction chamber. The radical generator is kept on for a predetermined time ($t_B$, typically ranging from a fraction of a second to several seconds) and switched off to provide a pulse of excited species B*. After a predetermined delay time ($t_S^2$), the cycle of A and B* pulses is repeated, until a desired layer thickness is achieved. Note that $t_S^2$ can be different from $t_S^1$. The microwave power used is generally on the order of 100 W-5 kw, and more preferably, is in the range of 500 W-2 kw. Note that in this preferred embodiment, the gas flow is almost constant, as B and C are flowing continuously and A<C, and B*<B*. After a wafer is processed, the chamber conditions (pressure, gas flow, and temperature) are adjusted, as is known in the art, to exchange the processed wafer for an unprocessed wafer and the processing cycle is repeated on the unprocessed wafer.

The delay times (e.g., $t_S^1$ and $t_S^2$) are adjusted to avoid undesirable levels of gas phase reaction and undesirable levels of uncontrolled reaction on the substrate surface. Undesirable levels of gas phase and uncontrolled surface reactions are those levels of reaction that result in unacceptable defects in the layers formed on the substrate. Such defects can render the processed substrate or wafer unusable. Time scheduling of pulses of reactants can readily be determined for a given reaction system and reactants by routine experimentation, as will be understood in view of the present disclosure, and is further discussed below with reference to FIGS. 3A-C. The delay times between pulses of reactants may be different and may change during processing if desired.

The apparatus of this invention can be provided with microprocessor and/or computer control for the automation of valves and for switching the generator of excited species on and off to provide desired timed pulses of reactants. Such controls are known in the art and can be readily provided for a given apparatus.

The apparatus of this invention has a gas inlet system having one or more gas inlets into the reaction chamber which allow establishment of carrier gas flow into the reaction chamber and into contact with a substrate surface in the chamber. The gas inlet system also allows introduction of one or more reactants including at least one reactant comprising excited species into the carrier gas flow which carries the reactants into contact with the substrate surface. Carrier gas flow is exhausted from the reaction chamber through a vacuum pump exhaust. The gas inlet system can have valves for generating concentration pulses of reactants. Preferably, excited species can be generated remotely from the reaction chamber. Excited species can also be generated in situ in the reaction chamber, as is known in the art. In the preferred case, the gas inlet system provides a separate conduit for introducing excited species into the carrier gas flow. The excited species can also be introduced into the carrier gas flow just before it enters the chamber. In this case, more losses of radicals are possible, but still enough radicals can be present to complete the reaction.

Although the invention is illustrated with a horizontal flow, cold wall reactor having a constant cross-section reaction area, other horizontal designs, such as hot wall reactors, can also be employed in the methods of this invention. Similarly, the invention can be readily adapted for use with vertical batch reaction chambers and furnaces, such as those described in U.S. Pat. Nos. 5,294,572, 5,336,325 and 5,662,470. The invention can also be readily adapted for use in reaction chambers in which gas flow is delivered perpendicular (rather than parallel) to the substrate surface, for example through an inlet positioned above the substrate surface, such as a shower head design. In each case, care is taken in reaction chamber design to avoid recirculation of reactants. Recirculation greatly enhances the residence time of reactive species which can lead to undesired gas phase reactions. Undesired gas phase reactions can lead to particle formation in the reaction chamber decreasing the quality of the layers formed on the substrate. Recirculation can be especially harmful when it occurs upstream from the wafer as then it affects the deposition process. Care must also be taken to operate the excited species as close as practically possible to the chamber to assure sufficient survival of radicals.

Figure 2A:
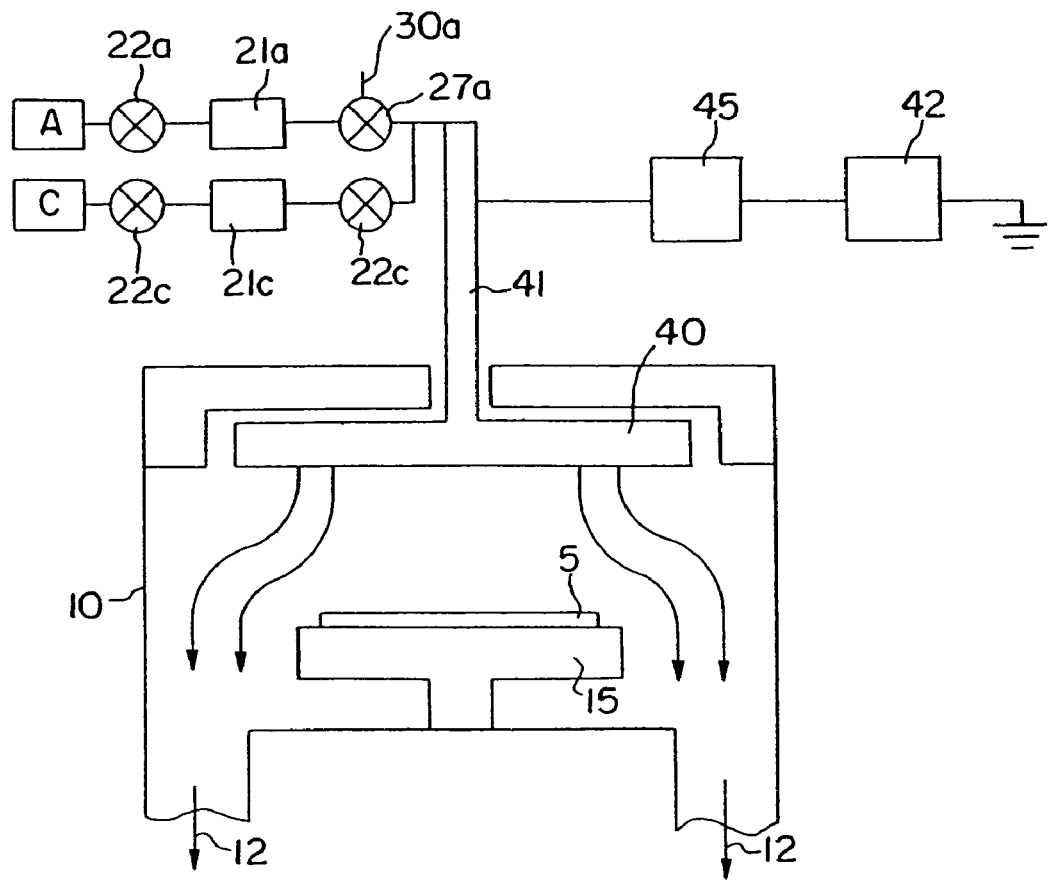
FIGS. 2A and B are a schematic illustration of alternate reaction chambers of this invention.

FIG. 2A illustrates an alternate reaction chamber 10 of this invention in which excited species are formed in the reaction chamber. In this case a showerhead inlet 40 is provided through which carrier flow and reactant gas pulses are established. A plasma can be generated by application of RF power electrically connected to the showerhead using an RF generator 42 coupled to an RF matching network, as is well-known in the art. Gas line 41 directs gases from gas manifolds into the showerhead inlet. A source of carrier gas C with valves and mass flow controller, as in the apparatus of FIG. 1, provides carrier gas flow into the chamber passing in contact with a substrate or wafer (5) on optionally heated holder 15 to exit through exhaust lines 12. A source of reactant A with valves, mass flow controller and dump circuit 30A, as in FIG. 1, provides concentration pulses of A into carrier gas C by timed operation of valve 27a. Pulses of A are alternated with pulses of RF power to generate alternate pulses of A and excited C* species. In this case, layers are formed by reaction of excited C* species with deposited A reactant. The pulses of A and C* are separated in time and space, as discussed above and in FIGS. 3A-3C below, to avoid an undesired level of gas phase or uncontrolled surface reactions. C can, for example, be nitrogen carrier gas and C* can be excited nitrogen species.

Plasmas may also be generated in the reaction chamber using RF coils as is known in the art. RF power can be modulated as is well-known in the art to provide concentration pulse of excited species. An alternate means for generating a plasma employing a showerhead-type inlet is disclosed in U.S. Pat. No. 5,134,965, which is incorporated by reference herein.

Figure 2B:
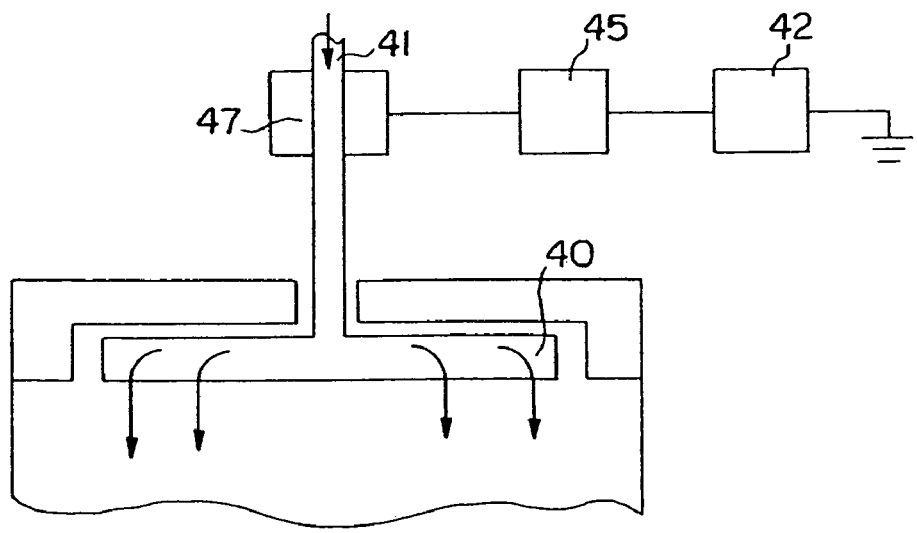
FIG. 2B is a reaction chamber with an excited species generator in the gas inlet line.

FIG. 2B illustrates an alternative reactor design with remote plasma generation of excited species employing a showerhead inlet 40. An RF cavity or coil 47 is provided in the inlet line 41. RF power is applied from RF generator 42 through RF matching network 45 to generate a plasma in the inlet line 41. Excited species are formed in the inlet by pulsing the RF power on and off. Concentration pulses of excited species are carried into the reaction chamber in the carrier gas flow. The operation of RF generators and RF matching circuits are well-known in the art.

Figure 3A:
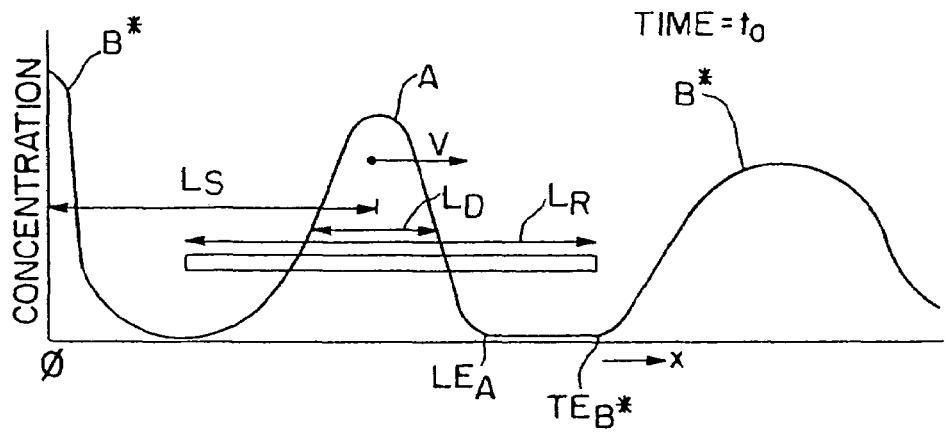
FIGS. 3A-C are graphs of reactant concentration as a function of distance x along a flow path through the reaction chamber schematically illustrating the progress of sequential pulses of reactants A and B* (containing radicals) in the same carrier gas flow through an apparatus of this invention.
Figure 3B:
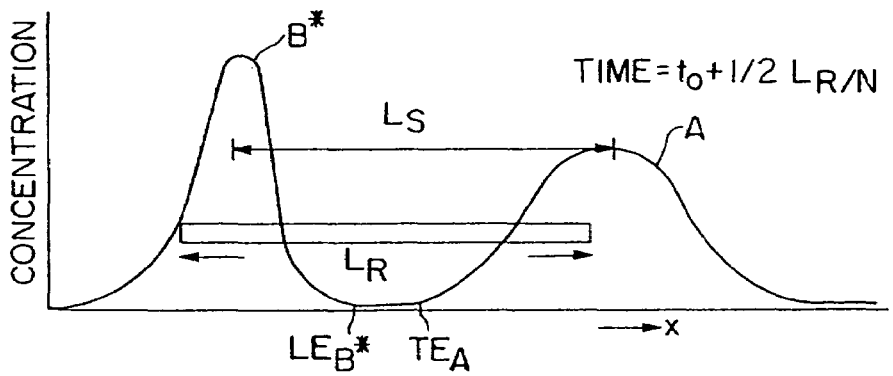

FIGS. 3A and 3B schematically illustrate, in one dimension (x), progress of gas pulses traversing the reaction chamber in graphs of reactant concentration as a function of flow distance through the reaction chamber. FIG. 3A is at time $t_0$, just as a pulse of reactant B* enters the reaction chamber (by, e.g., switching on the radical generator). At this time, an earlier pulse of A has traversed a distance equal to $L_S$ (the distance traversed in delay time $t_S$ between pulses of different reactant). In the drawing it is assumed that the time each of the gases is on is negligible compared to the delay time between gas pulses. $L_D$ is the characteristic diffusion length, a measure of the broadening of the reactant pulse as a function of time due to gas diffusion where $L_D=2\sqrt{Dt}$, where D is the diffusion coefficient of the reactant gas in the carrier and t is the residence time, where $t=L_R/D$. FIG. 3B illustrates the B* pulse and A pulse at time $t_0+\frac{1}{2}(L_R/v)$. As indicated in the these figures, pulses broaden due to diffusion of reactants when the pulses traverse the reaction chamber. Pulses illustrated in FIG. 3B are sufficiently separated in distance, despite pulse broadening, to avoid interaction and reaction of reactants in different pulses. $L_R$ is the length of the reaction chamber and v is the flow velocity of the gas (v=Q/pA, where Q is the mass flow rate, p is the pressure in the reaction chamber and A is the cross-sectional area of the reactor). The delay $t_S$ between pulses is preferably sufficiently long to minimize overlap of reactant gas pulses in the reactor chamber and minimize gas phase or uncontrolled surface reactions. Significant gas phase reactions or uncontrolled reactions on the surface are avoided when $L_D<L_S$, e.g., preferably where Ls is at least about 5-10 times $L_D$. It should be noted that short cycles are desirable to maximize the throughput of the reactor. The desire to minimize pulse overlap is a trade-off with increased throughput.

Table 1 presents the results of a calculation of $L_S$ and $t_S$ over the pressure range 0.2-20 Torr and $N_2$ gas flow rate (Q) range 1-50 slm, assuming $L_S=10\ L_D$. In most cases, the delay time ($t_S$) between pulses (e.g., the time between shutting of one reactant and admitting another reactant) is small, i.e., less than one second. The delay time exceeds one second only at the lowest flow and highest pressure. Thus, even when $L_S$ is constrained to be 10 $L_D$, reactant pulse sequences can follow each other in quite rapid succession, typically one every second, enabling a high layer growth rate. It should be noted that conditions do exist where $L_S>>L_R$. Essentially this implies that one reactant is fully purged from the reactor before the other reactant is introduced.

Figure 3C:
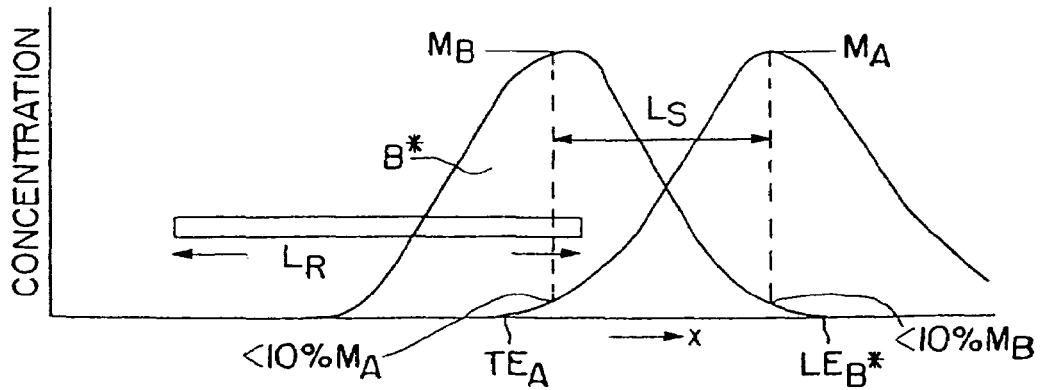

FIG. 3B illustrates a pulse time scheme in which the time between pulses is sufficiently long that adjacent pulses of reactants do not overlap as they broaden and traverse the reaction chamber. In this case, the leading edge ($LE_B^*$) of one pulse does not overlap the trailing edge ($TE_A$) of the preceding pulse. Significant gas phase reactions are avoided when $L_D$ is smaller (preferably 5-10 times smaller) than the distance between the trailing and leading edges of the pulses. FIG. 3C illustrates an embodiment where some overlap of reactant pulses is allowed. The amount of overlap illustrated in the figure typically does not result in levels of gas phase reaction or uncontrolled surface reaction that are high enough to detrimentally affect the quality of the layers formed on the substrate or wafer. The use of shorter delay times between pulses, so long as the quality of the layers is not detrimentally affected, is preferred to speed up processing times and thereby improve wafer throughput. Reactant pulse overlap can be characterized in terms of the relative concentration of the reactants at a given point in time, space or both during flow through the reactor. A preferred maximum overlap is defined as follows.

At any point in time or space where the concentration of reactant A is at its maximum ($M_A$), the concentration of reactant B* at that same point is less than about 10% of the maximum concentration of B* ($M_B$) and at any point in time or space where the concentration of reactant B* is at its maximum ($M_B$), the concentration of reactant A at that same point is less than about 10% of the maximum concentration of A ($M_A$). Delay times selected to meet this maximum overlap criterium typically provide sufficiently clean layer deposition and decreased process times. In certain cases where more reactive chemistries are employed for layer deposition, the maximum overlap should be decreased to avoid undesired reactions which can affect layer quality. In such cases, the maximum concentrations of reactants A and B* at the maximum concentrations of B* and A, respectively, is 1% or less.

Generally, it is preferred that the pulse reactant system is operated under conditions that minimize diffusion, i.e., at high flow velocity. Delay times $t_S$ between pulse of gas are selected as described above to avoid or minimize undesired gas phase reaction between reactants and undesired uncontrolled surface reactions and to minimize processing time. The preferred carrier gas or gases used are non-reactive with any reactants that are to be used in a given process and also non-reactive with the substrate surface. Examples are $N_2$, $H_2$, noble gases and mixtures of these, the choice of which depends upon the process choice or precursors and exposed layers. Reactant gases include pure reactant gases, a mixture of reactants, excited species (e.g., radicals) or mixtures of excited neutrals and mixtures of excited neutrals with diluent or carrier gas. Reactants are typically introduced into the reaction chamber in a carrier gas. Reactants are in the vapor phase when introduced into the reaction chamber.

In a cycle, consisting of one pulse of each reactant with appropriate delay times between pulses, one monolayer or less is typically grown (on the order of about 0.03-0.3 nm/layer). Practical films useful in semiconductor applications angle in thickness from about 1 to about 50 nm. Processing times in a single wafer processing apparatus for practical films will require about 6-600 s for the illustrated reactor.

The process cycle of layer deposition has been exemplified with sequential pulses of two reactants, one of which contains excited species. The apparatus and method of this invention can be employed in formation of complex layers requiring more than two reactants (including reactants containing excited or activated species or radicals). The schedule or order of multiple reactant pulses employed in this invention can be sequential or readily adapted to any order of reactant pulsing for a wide variety of deposition or layering processes. The method of this invention has been exemplified with sequential pulses of reactant separated by a selected delay time ($t_S$) and of selected pulse duration ($t_A$ and $t_B$). The delay time between pulses of reactants can be varied over the course of multiple cycles, so long as the delay time used is sufficient to avoid an undesirable level of gas phase or uncontrolled surface reaction among reactants. The pulse duration of the different reactants may be the same or different and will preferably be selected to achieve a desired level of surface reaction. The pulse duration of the same reactants over the course of multiple cycles of layer deposition may be the same or different and will also preferably be selected to achieve a desired level of surface reaction.

The reactant pulse schemes of FIGS. 3A-C, illustrate multiple pulses carried in a single flow of carrier gas, such as illustrated in the apparatus of FIG. 1 or FIG. 2. In alternative embodiments, sequential pulses of reactants can be delivered to a reaction area containing one or more substrates in separate carrier gas flows.

Radicals or excited species useful in processing of substrates include, among others, active nitrogen (N*, $N_2$*, $N_2^+$ or mixtures thereof) generated by microwave discharge of nitrogen, oxygen radicals generated by microwave discharge of oxygen, radicals or reactive species generated by photolysis or thermal decomposition. Plasmas for radical generation can be generated by microwave or RF energy, as is well-known in the art. Radicals or excited species tend to recombine or decay into the non-excited state during transport to the reaction area through gas phase reactions and on the walls of conduits. Therefore, it is beneficial to install the radical generator as close as practical to the reaction area on the wafer surface. Further, the pressures during transport of the excited species cannot be too high. Successful generation and transport of radicals has been demonstrated at pressures up to about 50 torr in $N_2$. Preferably the pressure in the apparatus of this invention is kept at about 5-10 torr.

Excited neutrals can include radicals, and atoms and molecules in excited electronic states. Excited neutrals can be generated in plasmas sustained by RF or microwave energy. Alternatively, they can be generated by irradiation of precursor neutral species at selected wavelengths including ultra-violet (U.V.), visible and infra-red (IR) wavelengths to decompose neutrals forming radicals and/or excited states. Excited neutrals, particularly radicals, can also be formed by thermal decomposition of precursors.

The apparatus of this invention is preferably implemented with a microwave radical, excited neutrals generator which may be remote from the reactor chamber or within the reaction chamber. For applications in the pulsed reactant system, pressures are selected to be sufficiently high to facilitate ignition of a plasma as well as to limit diffusion of reactant pulses into each other to avoid undesired reactions. Pressures are also selected to be sufficiently low to avoid substantial decay of excited species or recombination of radicals so that practical levels of excited species reach the reaction area. Reactor pressures ranging from about 0.5 up to 10-20 Torr are preferred. A preferred microwave plasma source which provides high efficiency at these relatively low reactant pressures is described in Steinhardt et al. U.S. Pat. No. 5,489,362, and is commercially available from $R^3T$, as noted above.

In a specific embodiment, the apparatus of this invention can be used to produce silicon nitride layers on silicon wafers. In this application, reactant A is $SiH_4$ using nitrogen as the carrier gas and the substrate is heated to about 300-550° C. B* is active nitrogen generated by passing nitrogen through a microwave radical generator. Repeated sequential pulses of $SiH_4$ and active nitrogen grows a SiN layer of desired thickness.

In other specific embodiments:

(1) Tantalum oxide layers can be deposited on appropriate substrates employing the apparatus of this invention. In this application, reactant A is volatile source of Ta, preferably tantalum pentaethoxide, using nitrogen carrier gas C and the substrate is heated to about 200° C.-400° C. B* are oxygen radicals generated by passing oxygen source gas B preferably $O_2$, through a microwave radical generator (2) Tantalum nitride layers can be deposited on appropriate substrates employing the apparatus of this invention. In this application, reactant A can be a volatile source of Ta, preferably pentakis(dimethylamino)tantalum using nitrogen carrier gas and the substrate is heated to about 200° C.-400° C. B* are nitrogen or ammonia radicals, which may be generated by passing nitrogen or ammonia through a microwave radical generator. Alternatively, a mixture of $N_2$ and $H_2$ can be passed through the radical generator. Tantalum nitride layers can be used, for example as a diffusion barrier in copper metallization;

(3) Titanium nitride layers can be deposited on appropriate substrates employing the apparatus of this invention. In this application, reactant A can be a volatile, non-oxygen containing Ti source, preferably pentakis(dimethylamino)titanium, using nitrogen carrier gas and the substrate is heated to about 200° C.-400° C. B* are nitrogen or ammonia radicals, which may be generated by passing nitrogen or ammonia through a microwave radical generator. Alternatively, a mixture of $N_2$ and $H_2$ can be passed through the radical generator. Titanium nitride layers can be used, for example, as a diffusion barrier in aluminum-based metallization;

(4) Metal layers, such as Ta or Ti, can be deposited on appropriate substrates employing the apparatus of this invention. In this application, reactant A can be $TaCl_5$ or $TiCl_4$, for example, using nitrogen carrier gas and the substrate is heated to about 200° C.-400° C. B* are hydrogen radicals, which may be generated by passing hydrogen through a microwave radical generator.

In yet another specific embodiment, the apparatus of this invention can be employed in the growth of layers by selective adsorption of a reactant. For example, under certain conditions metal organic precursors or $SiH_4$ can be made to preferentially adsorb onto Si and not onto $SiO_2$ or $SiN_4$. Exposure of the selectively adsorbed species on Si to radicals effectively completes reaction only on Si. Thus, a layer is grown only on the area of Si. Similar adsorption selectivity of reactants and selective layer growth can be achieved on metal areas (e.g., Cu or Al) with respect to dielectrics.

As noted above, the pulsed gas flow apparatus of this invention is preferably implemented in a horizontal flow reactor in a reactor system as described, for example, in Crabb et al. U.S. Pat. Nos. 4,828,224, 5,156,521, 5,092,728, and 5,435,682. A variety of substrates and wafers of different sizes, shapes and materials can be processed by the apparatus and method of this invention. Substrates are positioned in a substrate holder (a susceptor) that is typically heated. A variety of substrate holders are known in the art. Multiple substrates can be processed simultaneously, for example, by stacking the wafers in a boat, positioning wafers laterally apart on a single susceptor or by having multiple susceptors for holding one or more wafers in a reaction chamber.

Those of ordinary skill in the art will recognize that reactants, precursors of excited species, materials, procedures, conditions and structures other than those specifically described herein can be employed in the practice of this invention without expense of undue experimentation. All known functional equivalents of the reactants, precursors, materials, procedures, conditions and structures specifically disclosed herein are intended to be encompassed by this invention.

All references cited herein are incorporated by reference in their entirety herein to the extent that they are not inconsistent with the disclosure herein.

I claim:

1. An apparatus for growing a thin film which comprises:
   (a) a reaction chamber;
   (b) a substrate mounted in the reaction chamber;
   (c) a gas inlet system for establishing a carrier gas flow into the reaction chamber and for introducing pulses of two or more reactants into the carrier gas flow upstream of the substrate, wherein at least one of the reactants comprises excited species and wherein the gas inlet system comprises a first gas inlet directly into the reaction chamber for providing a first reactant to the reaction chamber and a second gas inlet directly into the reaction chamber for providing excited species to the reaction chamber; and wherein the pulses of reactants are sufficiently separated to minimize reaction of reactant in adjacent pulses in the reaction chamber;
   (d) a gas outlet; and
   (e) a control system to provide for the timing of pulses of reactants.

2. The apparatus of claim 1 further comprising a vacuum exhaust system in communication with the gas outlet.

3. The apparatus of claim 1 further comprising a generator of excited species for introduction into the carrier gas.

4. The apparatus of claim 3 wherein the generator of excited species is a microwave radical generator.

5. The apparatus of claim 4 wherein the microwave radical generator is remote from the reaction chamber.

6. The apparatus of claim 3 wherein excited species are produced in a plasma generated in the reaction chamber.

7. The apparatus of claim 3 wherein the first gas inlet is also in communication with a carrier gas source.

8. The apparatus of claim 1 wherein the pulses of reactants are sufficiently separated in time such that the characteristic diffusion length of the reactants sequential in the carrier gas ($L_D$) is smaller than the distance between the trailing and leading edges of the sequential pulses.

9. The apparatus of claim 8 wherein the pulses of reactants are sufficiently separated in time such that the characteristic diffusion length of the reactants in the carrier gas ($L_D$) is 5 to 10 times smaller than the distance between the trailing and leading edges of the sequential pulses.

10. The apparatus of claim 1 wherein pulses of a reactant without excited species alternate with pulses of a reactant comprising excited species.

11. The apparatus of claim 1 wherein the concentration of a reactant in a carrier gas flow at a point in space and time as it passes through the reaction chamber is no more than about 10% of its maximum value when at that point in space and time the concentration of a second reactant in a carrier gas flow is at its maximum value.

12. The apparatus of claim 1 wherein the concentration of a reactant in a carrier gas flow at a point in space and time as it passes through the reaction chamber is no more than about 1% of its maximum value when at that point in space and time the concentration of a second reactant in a carrier gas flow is at its maximum value.

13. The apparatus of claim 1 wherein alternating pulses of a reactant are carried in the same carrier gas flow.

* * * * *

UNITED STATES PATENT AND TRADEMARK OFFICE
CERTIFICATE OF CORRECTION

PATENT NO. : 7,431,767 B2 Page 1 of 1
APPLICATION NO. : 11/605615
DATED : October 7, 2008
INVENTOR(S) : Raaijmakers It is certified that error appears in the above-identified patent and that said Letters Patent is hereby corrected as shown below:

In Claim 9, col. 12, line 10, please change "($L_{D)\ is}$" to --($L_D$) is--.

Signed and Sealed this

Thirty-first Day of March, 2009

JOHN DOLL
*Acting Director of the United States Patent and Trademark Office*